United States Patent [19]

Russell et al.

[11] Patent Number: 5,310,989
[45] Date of Patent: May 10, 1994

[54] METHOD FOR LASER-ASSISTED ETCHING OF III-V AND II-VI SEMICONDUCTOR COMPOUNDS USING CHLOROFLUOROCARBON AMBIENTS

[75] Inventors: Stephen D. Russell; Douglas A. Sexton; Richard J. Orazi, all of San Diego, Calif.

[73] Assignee: The United States of America as represented by the Secretary of the Navy, Washington, D.C.

[21] Appl. No.: 831,830

[22] Filed: Jan. 21, 1992

Related U.S. Application Data

[62] Division of Ser. No. 508,317, Apr. 10, 1990.

[51] Int. Cl.⁵ .............................. B23K 9/00
[52] U.S. Cl. .............. 219/121.68; 156/643; 437/19
[58] Field of Search .......... 156/643; 437/19; 219/121.61, 121.68

[56] References Cited

U.S. PATENT DOCUMENTS

| | | | |
|---|---|---|---|
| 4,151,008 | 4/1979 | Kirkpatrick | 219/121.61 X |
| 4,780,590 | 10/1988 | Griner et al. | 219/121.61 X |
| 4,865,923 | 9/1989 | Ralston et al. | 437/19 X |
| 5,053,171 | 10/1991 | Portney et al. | 219/121.61 X |
| 5,059,764 | 10/1991 | Baer | 219/121.61 X |
| 5,061,643 | 10/1991 | Yagi | 437/19 |

*Primary Examiner*—Peter A. Nelson
*Attorney, Agent, or Firm*—Harvey Fendelman; Thomas Glenn Keough

[57] ABSTRACT

An etching process allows a selective single-step patterning of III-V or II-VI semiconductor compound devices such as GaAs and InP or CdS and ZnSe in a noncorrosive environment. The etching relies on a maskless laser-assisted technique in a gaseous chlorofluorocarbon ambient, such as gaseous dichlorodifluoromethane and chloropentafluoroethane. Laser-assisted photothermal chemical etching reactions on the III-V or II-VI semiconductor compounds occur in these ambients when the incident fluence from an excimer laser at 248 nm exceeds the melt threshold. This provides a means for thin membrane formation in III-V or II-VI semiconductor compounds, rapid etches and processing of packaged devices or partially fabricated dies. The reduction in processing steps as compared to conventional wet chemical etches provides improvements in yield, reliability and cost.

26 Claims, 12 Drawing Sheets p+ -type (100)Si p -type (100)Si n -type (100)Si n+ -type (100)Si

METHOD FOR LASER-ASSISTED ETCHING OF III-V AND II-VI SEMICONDUCTOR COMPOUNDS USING CHLOROFLUOROCARBON AMBIENTS

STATEMENT OF GOVERNMENT INTEREST

The invention described herein may be manufactured and used by or for the Government of the United States of America for governmental purposes without the payment of any royalties thereon or therefor.

CROSS REFERENCE TO RELATED APPLICATION

This application is a division of copending United States pending patent application Ser. No. 508,317, filed Apr. 10, 1990.

BACKGROUND OF THE INVENTION

Advances in microelectronics often are limited by the multitude of relatively complicated processing steps required to produce the devices. A typical example of the number of processing steps is apparent in the trench isolation technique in bulk silicon which has been investigated as a means of dielectric isolation. This technique requires etching of deep trenches between devices on the die followed by oxide growth in the trenches to form the dielectric isolation. The etching steps call for the application of a photoresist with a subsequent low temperature heat treatment. This is followed by exposure to a lamp through a mask in contact with the photoresist and development of the resist. Another heat treating step is next, then the silicon trenches are chemically etched and, lastly, the remaining photoresist subsequently is stripped from the silicon. These seven steps are typical in many standard etching techniques used in the semiconductor industry. It becomes apparent that significant savings and yield could be obtained through the more simplified procedures that might be provided by a maskless, contactless form of etching. The reduced complexity of such a procedure would eliminate the many time consuming and costly steps of the conventional etching technique.

Another particular example of the excessive number of processing steps required to produce microelectronic devices becomes apparent when noting the procedures used to fabricate a backside illuminated charge-coupled device (CCD). CCDs designed for solid-state cameras, such as camcorders, are in great demand and are widely available. They have been designed to provide adequate performance when viewing brightly illuminated scenes. However, in astronomical, scientific and military applications their spectral response, readout noise, dark current, full well-capacity and blooming characteristics are not satisfactory.

To overcome the limitations of imaging through the polysilicon gates that necessarily cover all of the sensitive pixel array, it would be desirable to illuminate the CCD from the backside if the silicon substrate were thin enough. In other words, a solution to obtaining better light sensitivity would be the thinning of the backside of the CCD to a total thickness of roughly 10 microns. The need is quite apparent for new microelectronic processing schemes to produce thin membranes such as those required for the backside illuminated CCDs. Additional features that should attend this thinning process are the creation of a smooth surface for uniform imaging, non-reflecting sidewalls for stray light rejection and large (approximately 2 mm by 2 mm) square cross section for optimal illumination of the active area of the array.

A conventional fabrication procedure for backside illuminated CCDs calls for chemical thinning of the silicon. However, the standard wet chemical thinning-etch procedure produces an extremely low yield process and requires the handling of fragile thin silicon membranes. Furthermore, the chemical thinning requires two processes, a deep etch using potassium hydroxide and a subsequent Dash polishing etch. The latter consists of applying a mixture of acetic, nitric and hydrofluoric acids along with a surfactant. The Dash etch process also requires additional masking to protect the frontside metalization and backside gold eutectic used for packaging. Additional cleaning and inspection steps are required to complete the thinning process. Elimination of these steps would allow further "dry" processing of the thinned die, such as laser doping or dopant activation. In addition, the minimization of the required number of processing steps always is desirable in this microelectronic processing procedure to maximize the yield and reliability while also reducing costs.

In view of the foregoing, noncontact, maskless processing is receiving widespread interest in the microelectronic industry. A variety of laser-assisted processing techniques to modify materials used in this industry are being pursued, particularly with the introduction of the excimer laser which typically emits at the shorter wavelengths. The works of D. Ehrlich et al. in their article "A review of Laser-Microchemical Processing" *J. Vac. Sci. Technol. B.*, 1, 969 (1983), F. Houle, in her article entitled "Basic Mechanisms in Laser Etching and Deposition" *Appl. Phys. A*, 41, 315 (1986), D. Bauerle in the article entitled "Chemical Processing with Lasers: Recent Developments" *Appl. Phys. B*, 46, 261 (1988), and T. Chuang in the article entitled "Laser-Induced Chemical Etching of Solids: Promises and Challenges" in A. Johnson et al., ed's, *Laser Controlled Chemical Processing of Surfaces*, Materials Research Society Symposia Proceedings, Vol. 29 (New York: North Holland, 1984), pp. 185-194, offer a review of the effort involved with laser-assisted processing techniques. As a consequence, laser processing has grown from a purely research effort into a production tool. Early on, however, investigations related to laser processing of silicon led to the conclusion that laser ablation of silicon using an excimer laser was considered undesirable since the surface quality would be poor, although the rate of material removal would be high.

The use of halogens to etch silicon is well established by the text of the Gutmann, *Halogen Chemistry*, Vol 2 (New York: Academic Press, 1967), pp. 173-180. In addition, an existing body of research for plasma processing of silicon offered another group of candidate etchants as described by H. F. Winters et al. in the article "Surface Processes in Plasma-Assisted Etching Environments" *J. Vac. Sci. Technol. B*, 1, 469 (1983) and B. A. Heath et al. in the article "Plasma Processing for VLSI" chapter 27 in M. G. Einspruch, ed. *VLSI Handbook* (San Diego: Academic Press, 1985) pp. 487-502.

The laser-assisted etching of silicon has been examined using a chlorine ambient by R. Kullmer et al. in their article "Laser-Induced Chemical Etching of Silicon in Chlorine Atmosphere: I. Pulsed Irradiation" *Appl. Phys. A*, 43, 227 (1987), P. Mogyorosi et al. in the article entitled "Laser-Induced Chemical Etching of Silicon in Chlorine Atmosphere: II. Continuous Irradiation" *Appl. Phys. A*. 45, 293 (1988), R. Kullmer et al. in the article "Laser-Induced Chemical Etching of Silicon in Chlorine Atmosphere: Combined CW and Pulsed Irradiation" *Appl. Phys. A*, 47, 377 (1988), Y. Horiike et al. in the article "Excimer Laser Etching on Silicon" *Appl. Phys. A*. 44, 313 (1987) and W. Sesselmann et al. in their article entitled "Chlorine Surface Interaction and Laser-Induced Surface Etching Reactions" *J. Vac. Sci. Technol. B*, 3, 1507 (1985). S. Palmer et al. in their article entitled "Laser-Induced Etching of Silicon at 248 nm in $F_2$/Ne" *Conference on Lasers and Electro-optics Technical Digest Series* 1988, Vol. 7, 284 (Optical Society of America, Washington, D.C., 1988) examined the fluorine ambient.

The use of nitrogen trifluoride ambient was discussed by J. H. Brannon in his article entitled "Chemical Etching of Silicon by $CO_2$ Laser-Induced Dissociation of $NF_3$" *Appl. Phys. A*, 46, 39 (1988) and the above referenced article by Y. Horiike et al. The use of the halogenated ambient xenon difluoride was discussed by T. Chuang, "Infrared Laser Radiation Effects on $XeF_2$ Interaction with Silicon" *J. Chem. Phys.*, 74, 1461 (1981), by F. Houle "Photoeffects on the Fluorination of Silicon: I. Influence on Doping on Steady State Phenomena" *J. Chem. Phys.*, 79, 4237 (1983) by F. Houle in the article "Photoeffects on the Fluorination of Silicon: II. Kinetics of the Initial Response to Light" *J. Chem. Phys.*, 80, 4851 (1984). And, the use of halogenated ambient sulphur hexafluoride was examined by T. Chuang in his article entitled "Multiple Photon Excited $SF_6$ Interaction with Silicon Surfaces" *J. Chem. Phys.*, 74, 1453 (1981).

Typical etch rates of approximately one angstrom per pulse have been reported for the ambients of the preceding paragraphs under a variety of conditions. Such etch rates with the high pulse repetition rate of the excimer laser (100 Hz typical, 250 Hz available) were satisfactory to meet yield requirements of some applications. However, difficulties in handling and processing pure halogens such as chlorine and fluorine make them less suitable for inserting into existing manufacturing processes. Furthermore, pure halogens and many halogenated ambients are corrosive in nature and will spontaneously react with some (or all) of the materials composing a partially fabricated microelelectronic device. Masking, therefore, is required in such ambients despite the non-contact nature inherent in laser processing. Masking may be difficult or impossible in many applications. In addition, the detrimental effects of chlorine on the radiation hardness of silicon devices makes it potentially unsuitable for a wide variety of military or space applications. There also is evidence to at least suggest that the use of chlorine creates rough surfaces.

The use of laser-assisted wet etching was explored by R. Osgood Jr. et al. in "Localized Laser Etching of Compound Semiconductors in Aqueous Solutions" *Appl. Phys. Lett.*, 40, 391 (1982), R. von Gutfeld et al. in "Laser-Enhanced Etching in KOH" *Appl. Phys. Lett.*, 40, 352 (1982) and F. Bunkin et al. in "Laser Control Over Electrochemical Processes" SPIE Vol. 473, *Symposium OPPIKA' 84*, Vol. 473, pp. 31–37. The drawback to the laser-assisted wet etching technique is that it requires a different processing chamber to that of the gaseous "dry" etching technique and would require additional handling for further processing.

M. D. Armacost, S. V. Babu, S. V. Nguyen, J. F. Rembetski, in their article "193 nm Excimer Laser-Assisted Etching of Polysilicon", *Mat. Res. Soc. Symp. Proc.*, Vol. 76, (1987), pp. 147–156, examine various ambients for etching polysilicon. They used two halocarbon ambients but found etch profiles that were not repeatable or did not show any appreciable etching. They did not examine the effects of etching silicon, nor investigate the critical parameters and processing windows required to achieve the results attained in accordance with this inventive concept.

The article by D. J. Ehrlich et al. "Laser Induced Microscopic Etching of GaAs and InP *Appl. Phys. Lett.*,36(8), 15 April 1980 discusses laser induced etching of GaAs and Inp in an ambient of methyl-halides (halocarbons) $CH_3Br$, $CF_3I$ and $CH_3Cl$. The etching reactions discussed here depend on the absorption of the UV light by the gaseous ambient in order to dissociate the halogen atoms which react (etch) the sample. Therefore, in the case of InP etching by $CH_3Cl$, a minimal etch rate was observed (impractical for applications) because of weak absorption of $CH_3Cl$ at the UV laser wavelength used. This invention does not require absorption of the UV light by the ambient to cause the chemical reaction, in fact, absorption by the ambient is detrimental in the process of this invention because it minimizes the amount of energy impinging on the sample necessitating additional laser energy to initiate the reaction. This paper does not discuss etching in chlorofluorocarbon ambients, pyrolytic (thermal) dissociation of the ambient, nor exhibit etch rates as large as those disclosed in this invention. The article by Peter Brewer et al. entitled "Photon-Assisted Dry Etching of GaAs" *Appl. Phys. Lett*, 45(4), 15 Aug 1984 discusses laser induced etching of GaAs in a $CH_3Br$ or $CF_3Br$ ambient. The reaction discussed requires absorption of the UV light by the ambient resulting on photolytic decomposition. As discussed herein, this differs from the pyrolytic decomposition method and apparatus of this invention and would, in fact, have a detrimental effect in the process of this invention. Furthermore, the layer etch rates represented in this article correspond to ablation of the sample causing significant materials damage and roughening at large laser energy densities (fluences). Variations in etch rate were found for different crystal orientations in contrast to no crystal orientation difference in the method of this invention. The article by Y. Rytz-Froidevaux et al. entitled "Laser Generated Microstructures" *Appl. Physl. A.*,37, 121–138,(1985) reviews laser-assisted deposition and etching processes on a variety of materials. Both III–V and II–VI semiconductor compounds are discussed using aqueous solutions as well as gaseous methy-halides and alkali halide salts. These reactions are photolytic in nature, as discussed above and, therefore, the absorption of the laser light would be detrimental in the process of this invention.

Thus, there is a continuing need in the state of the art for a maskless and contactless technique utilizing an excimer laser to promote a chemical reaction between a chlorofluorocarbon ambient and III–V semiconductor compounds gallium arsenide, GaAs, or indium phosphide, InP and their related ternary and quaternary compounds and II–VI semiconductor compounds cadmium sulfide, CdS, or zinc selenide, ZnSe, and their related ternary and quaternary compounds that eliminates many standard processing steps and has the advantage of processing in a prepackaged and pretested device and that can be extended to applications requiring micromachining or other depth profile-reducing techniques.

SUMMARY OF THE INVENTION

The present invention is directed to providing an apparatus and method for a maskless and contactless technique to promote a chemical etching reaction between a gaseous chlorofluorocarbon ambient and III-V semiconductor compounds gallium arsenide, GaAs, or indium phosphide, InP and their related ternary and quaternary 18 compounds or II-VI semiconductor compounds cadmium sulfide, CdS, or zinc selenide, ZnSe, and their related ternary and quaternary compounds which are exposed to the UV energy emitted by an excimer laser.

An object of the invention is to reduce the processing steps associated with microelectronic fabrications.

Another object is to provide a microelectronic processing method utilizing a nonreactive or noncorrosive ambient.

Another object is to provide a laser-assisted etching process with gaseous chlorofluorocarbons that only react with a III-V or a II-VI semiconductor compound sample such as InP or GaAs or CdS or ZnSe where the laser energy is impinging with sufficient fluence.

Another object is to provide a laser-assisted etching process with chlorofluorocarbons that only react with III-V or II-VI semiconductor compound sample such as InP or GaAs or Cds or ZnSe where the laser energy is impinging with sufficient fluence.

Another object is to provide a laser-assisted etching process for etching in a pretested package die without expensive handling, damage or complex masking.

Another object is to provide a laser-assisted etching process in a chlorofluorocarbon ambient that significantly eliminates processing steps, thereby increasing reliability and yield.

Another object is to provide a laser-assisted etching process in a nonreactive chlorofluorocarbon ambient for pattern etching with a maskless processing procedure.

Yet another object is to provide a laser-assisted etching process for backside thinning of charged coupled devices.

Another object of the invention is to provide a laser-assisted etching process in which an excimer laser promotes a chemical reaction between a chlorofluorocarbon ambient and a III-V or II-VI semiconductor compound sample such as InP or GaAs or Cds or ZnSe.

Another object of the invention is to provide a laser-assisted etching process in which an excimer laser promotes a chemical reaction between a chlorofluorocarbon ambient and a III-V or II-VI semiconductor compound sample such as InP or GaAs or Cds or ZnSe in which a high degree of anisotropy of the etch exceeds that of standard wet etches and is useful as a highly selective etch.

Yet another object is to provide a non-ablative, laser assisted etching process that exhibits an etch rate greater than one monolayer per pulse.

Another object is to provide a chlorofluorocarbon ambient and a laser-induced chemical reaction therein to provide for a maskless, contactless etching process.

These and other objects of the invention will become more readily apparent to one skilled in the art to which this invention pertains in view of the ensuing specification when taken in conjunction with the claims and drawings.

DESCRIPTION OF THE PREFERRED EMBODIMENT

Figure 1:
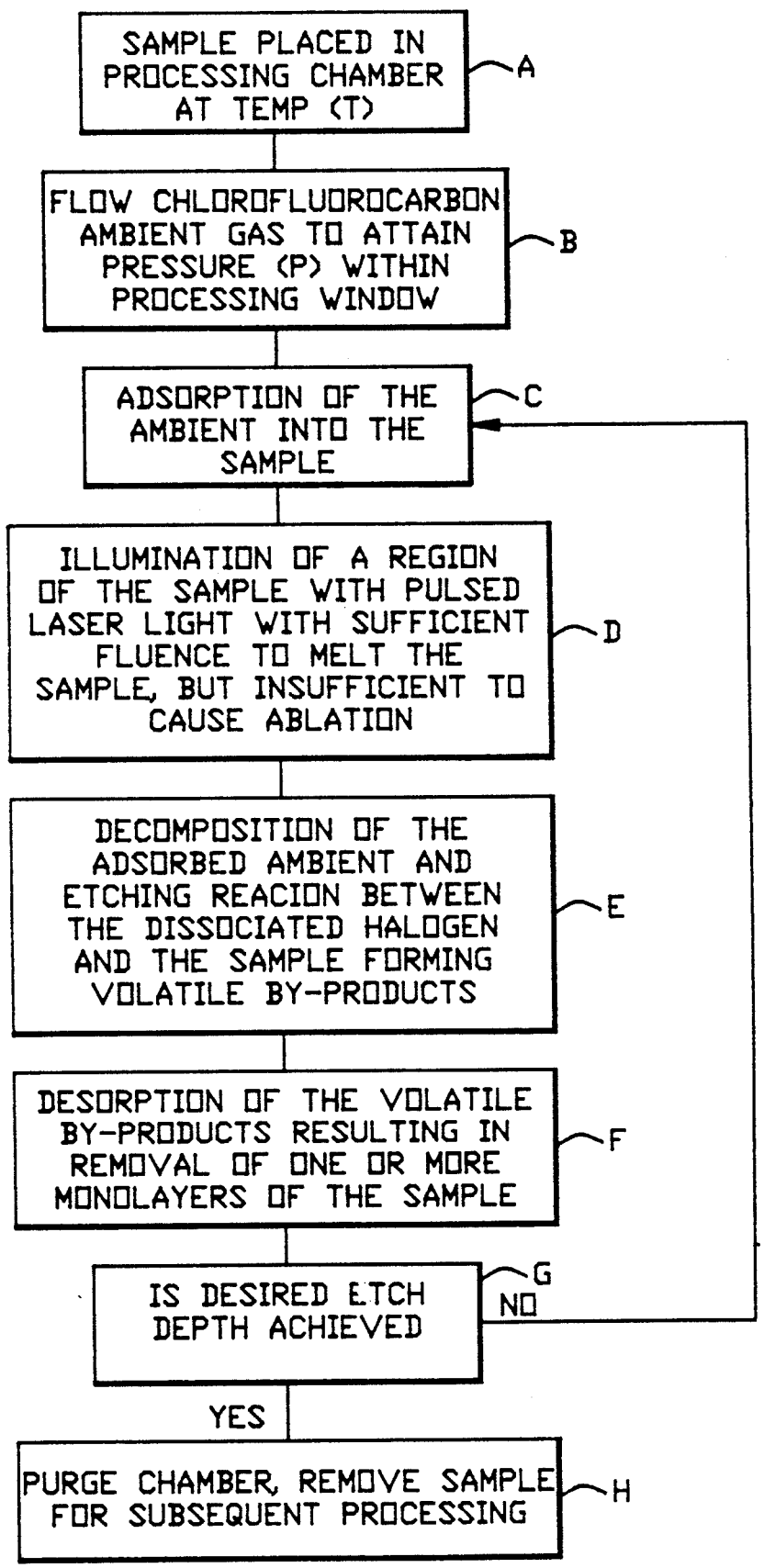
FIG. 1 shows a schematic flow chart of the inventive method.

Referring to FIG. 1, this invention concerns a maskless process for the etching of silicon, a method that is particularly well suited for the production of thin membranes required for backside illuminated CCDs and for large area patterning in microelectronics, for example. A sample S which may be a wafer, wafer die or packaged device, is placed A within a chlorofluorocarbon gas ambient B, at a predetermined pressure and temperature. There is some adsorption C of the ambient onto the sample which is selectably illuminated D by a UV laser beam to effect a decomposition E of the adsorbed ambient. The desired region on the surface of the sample is melted by the beam and one or more monolayer of the sample are removed or desorbed (etched). The etching reaction occurs since the halogen atom(s) in the adsorbed halocarbon ambient dissociates and a volatile species is formed from the reaction between the halogen and the molten sample. The volatile reaction by-product is desorbed F from the surface and is pumped from the chamber. The chlorofluorocarbon ambient is re-adsorbed onto the sample and the process repeats G if desired. The chamber may be purged H and the sample removed, if desired.

Figure 2:
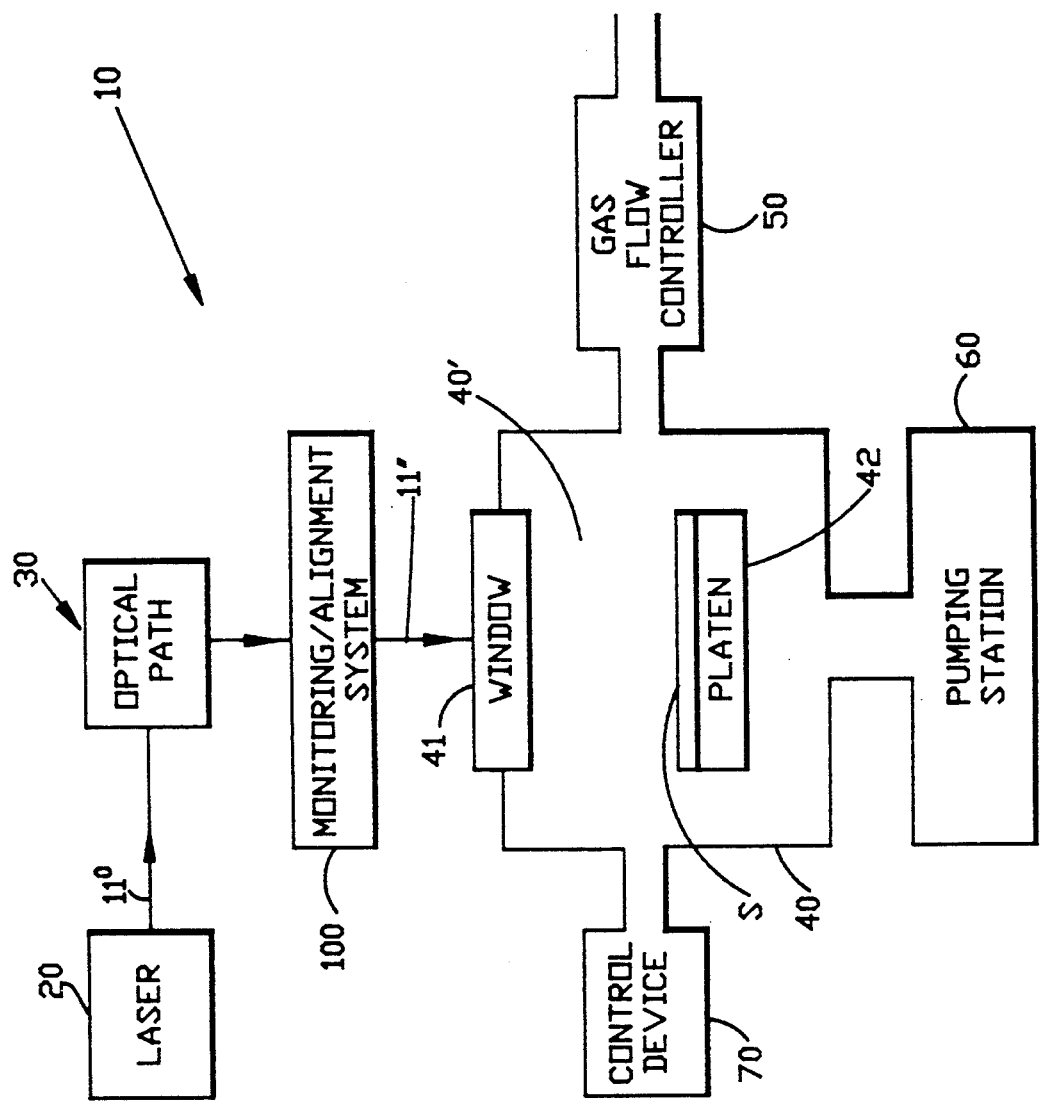
FIG. 2 schematically shows the processing setup used for excimer laser-assisted etching.

Referring now to FIG. 2 of the drawings, a laser-assisted-chlorofluorocarbon sample etcher 10 includes an excimer laser system 20 that emits a beam 11° through an optical path system 30. The optical path system homogenizes, shapes and directs the beam into a processing chamber system 40 containing a chlorofluorocarbon ambient gas 40' and onto a sample S.

A gas mass flow controller system 50 is used to flow and pressurize chlorofluorocarbon process and purge gases with respect to the processing chamber system. Removal of reaction by-products is accomplished via a pumping station 60 connected to the process chamber system. A capacitive manometer-process control device 70 is attached to the process chamber to monitor ambient chlorofluorocarbon gas pressure. In situ monitoring/alignment system 100 is included for positioning of sample S where the laser beam which will impinge on the sample. System 100 may also include a beam diagnostic system 110, a reflectivity monitor 120, a laser alignment system 130, an in situ monitoring system 135, and a temporal profile and energy measurement system 140 are included to calibrate incident laser fluence. The details of the elements of the systems will be elaborated on below and will make readily apparent to those skilled in the art an appreciation of the salient features of this inventive concept.

The processing parameters of interest for the laser-assisted etching of a sample in accordance with this inventive concept are the laser fluence, pulse repetition rate, ambient chlorofluorocarbon gas, ambient chlorofluorocarbon gas pressure and sample temperature. Regulation of these parameters in accordance with the capabilities of this inventive concept permits the controlled and desired etch-processing of a sample.

Figure 3:
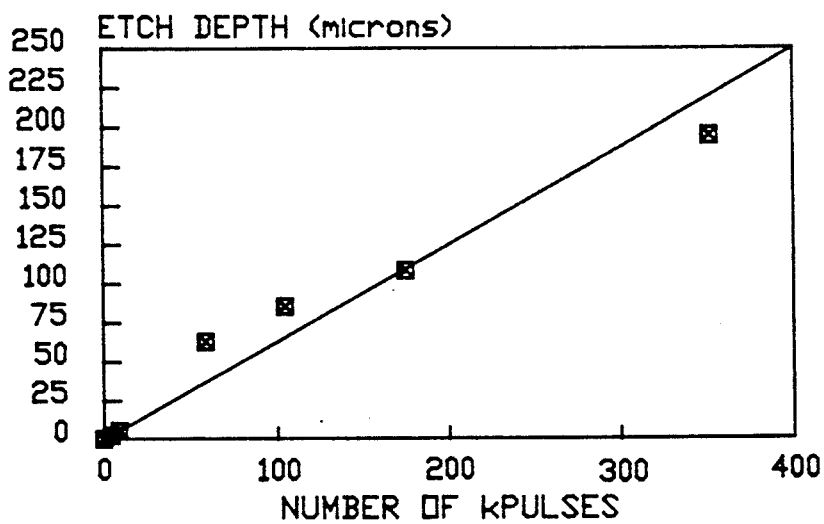
FIG. 3 shows the etch depth versus number of pulses for silicon in a chloropentafluoroethane ambient.

By way of example, FIG. 3 shows that the etch depth is a function of the number of laser pulses for silicon in a chloropentafluoroethane (Freon-115) ambient within the gas pressure process window. Substantially linear dependence is observed. Extrapolating these results, 300 microns of silicon can be etched within 90 minutes while operating the laser at 100 Hz. Higher repetition rates which heat a sample objectionably can be accommodated by cooling the sample during processing. This cooling of the sample can be brought about by circulating a coolant through a platen 42, see FIG. 1, on which sample S is placed or, optionally, the halocarbon ambient could be cooled.

Figure 4:
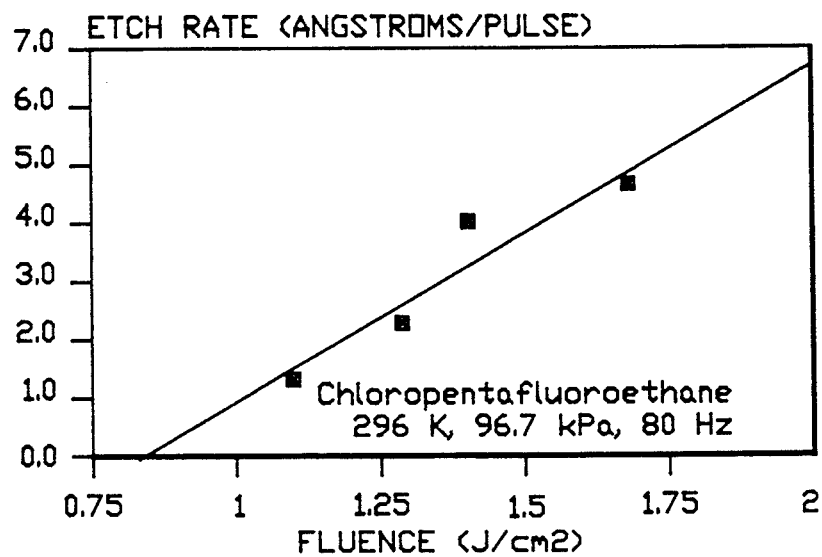
FIG. 4 represents the linear dependence of etch rate with laser fluence between the melt threshold for silicon (0.75 J/cm$^2$) and the ablation threshold (2.0 J/cm$^2$).

FIG. 4 provides an insight of the linear dependence of etch rate with laser fluence between the melt threshold for silicon (0.75 J/cm$^2$) and the ablation threshold (2.0 J/cm$^2$) at 727 torr (96.7 kPa) of chloropentafluoroethane ambient and constant temperature (196 K). The square data points are with the laser at 80 Hz, the dotted line is a linear regression fit to these points exhibiting a correlation of 0.97. Operation within this fluence window allows for a controllable chemical reaction. No significant etching occurs below the melt fluence. Increasing fluence increases the duration that the silicon remains in the molten state, which results in an increased etch rate. This behavior can be explained by a one dimensional thermal model where the increase in temperature is directly proportional to the absorbed surface fluence. Comparison between the etch rates of similarly doped and processed (100) and (111) silicon samples show no difference within reasonable uncertainties. This is attributed to the etching reaction ocurring while the silicon is in the molten state. The anisotropy of the etch is therefore governed by both the incident intensity profile causing the melt and the thermal diffusivity. Above the ablation threshold, nonlinear explosive reactions occur which are not suitable for controlled processing of silicon since operation above the ablation threshold tends to create pits and other unacceptable irregularities in the silicon surface.

Figure 5:
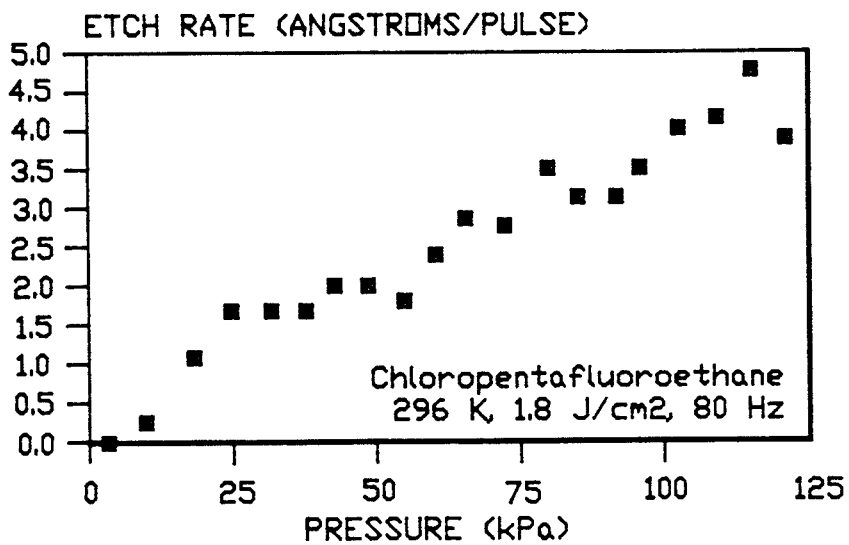
FIG. 5 represents the etch rate as a function of pressure in a chloropentafluoroethane ambient.

FIG. 5 is representative of the etch rate as a function of pressure in a chloropentafluoroethane (Freon-115) ambient. Both the fluence and sample (platen) temperature are kept at constant values, 1.8 J/cm$^2$ and 296 K, respectively. Data is plotted verses the SI pressure units of kPa, with the conversion: 13.3 kpa=100 torr. At pressures below about 45 torr (6 kPa), there is no existence of etching. The onset of significant etching occurs at roughly 150 torr (20 kPa). Optimal processing occurs between 600 to 900 torr (about 70 to 120 kPa) where the etch rate is greater than 3 angstroms per pulse (at 1.7 J/cm$^2$). From these figures it is apparent that the pressure processing window can accommodate some variations in gas pressure, allowing for less constraining conditions and making for a less complicated manufacturing process. Etch rates as high as approximately 15 angstroms per pulse have been observed at higher fluences (and lower temperatures).

Figure 6:
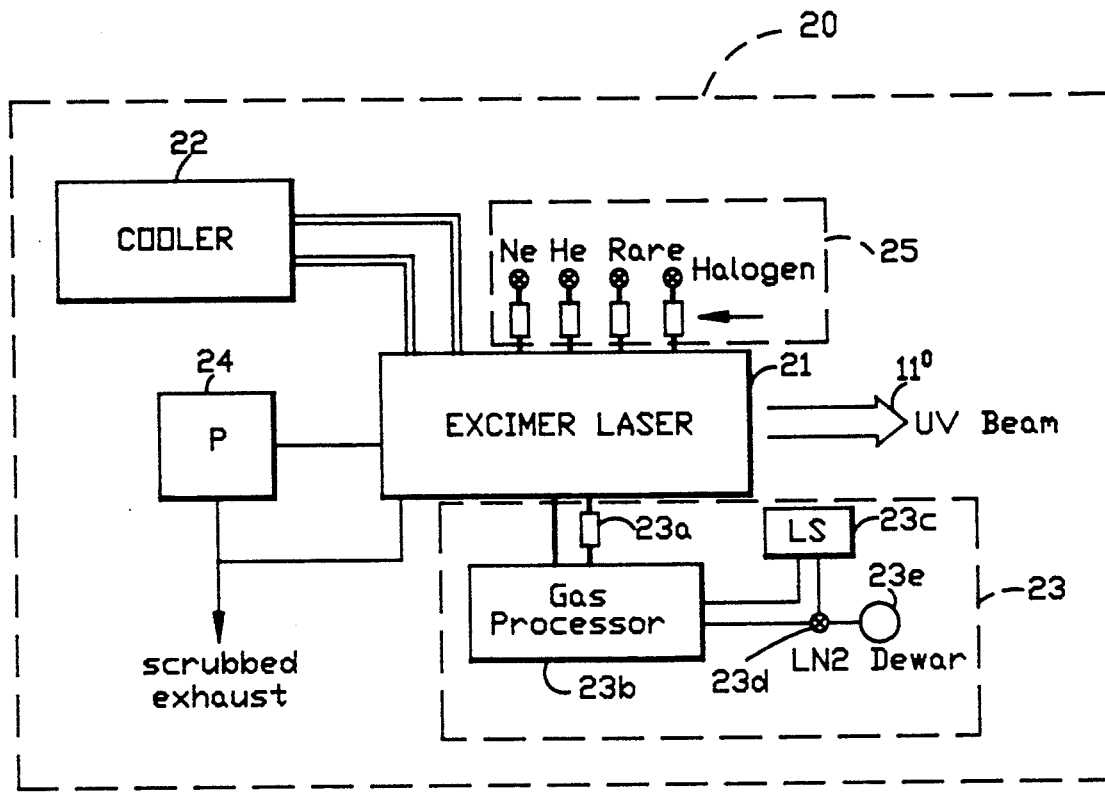
FIG. 6 is a depiction of a representative laser system for inclusion in this inventive concept.

Looking to FIG. 6, excimer laser system 20 includes an excimer laser 21, a closed cycle laser cooler 22, a cryogenic processing system 23, a vacuum pump 24, and a combination gas delivery and exhaust system 25.

Laser 21 is a high-powered, high-repetition rate excimer laser which is inherently modifiable to meet the changing requirements of the job at hand. As such, wavelength, pulse length, pulse energy, and repetition rates are variable. A Questek's model 2860 excimer laser is selected although any number of such devices could be employed provided its operating characteristics were satisfactory for the job at hand. This laser is operated using a krypton fluoride gain medium (KrF*) which provides about 600 mJ/pulse at 100 Hz (720 mJ/pulse at 1 Hz) at a wavelength of 248 nm. Typical pulse to pulse energy variations are ±5 mJ. The full width half maximum of the temporal profile (pulse length) of the laser pulse is typically 25±2 nanoseconds. Table 1 lists the laser specifications.

TABLE 1

| list of Laser Specifications | | | | |
|---|---|---|---|---|
| GAIN MEDIUM | ArF | KrF | XeCl | XeF |
| WAVELENGTH | 193 | 248 | 308 | 351 |
| MAX REP. RATE | ... 100 Hz ... | | | |
| MAX PULSE ENERGY (mJ) | 425 | 750 | 400 | 350 |
| MAX POWER (W) | 25 | 70 | 40 | 24 |
| BEAM DIAMETER [V × H] | ... 6–13 mm × 20 mm ... | | | |
| BEAM DIVERGENCE [V × H] | ... 2 mrad. × 3 mrad ... | | | |

The laser utilizes a stable optical cavity using a blank magnesium fluoride (MgF) output coupler, and either an aluminum coated (MgF) multiwavelength high reflector or a dielectrically coated (MgF) high reflector selected for 248 nm radiation.

Although a CW mode laser is not elaborated upon, some applications could lend themselves to the use of such a device. For the purposes of providing a more understandable disclosure of this inventive concept, it has been found to be more expedient to speak in terms of a more precisely measurable pulsed energy coming from a laser. In addition, the higher energy levels of shorter wavelengths, such as UV, have channeled the disclosure to refer to excimer lasers. Other sources of shorter wavelength energy may be used if they can produce the needed energy levels.

Successful operation of excimer laser 21 of laser system 20 for its intended application requires the associated equipment schematically shown in FIG. 6. Closecycle laser cooler 22 is a Neslab's model HX-150 refrigerated recirculator that is used to cool the laser thyratron and capacitor banks to about 20° C. Cryogenic gas processing system 23 includes a 0.5 micron particulate filter 23a and a temperature-controlled gas processor 23b, an Oxford Lasers model GP2000 which recirculates clean gas back into the laser cavity continuously.

Within the gas processor 23b, the laser medium is cooled to 100 K to trap particulates and lasing by-products without trapping krypton. This improves dynamic gas lifetime by roughly a factor of two.

An automatic liquid nitrogen fill is implemented to maintain optimal gas processing throughout the duration of a laser-assisted etching process. A liquid nitrogen level sensor 23c (a Streco model 400 liquid nitrogen level sensor) controls a cryogenic temperature solenoid valve 23d which allows the appropriate amount of liquid nitrogen to flow from a liquid nitrogen dewar 23e through an insulated transfer line into a cryogenic, temperature-controlled gas processor 23b. A mechanical pump 24, a Hanning type 006-376 supplied with excimer laser 21 is used to evacuate the laser cavity for service and changing the gain medium gas and is drawn to a scrubbed exhaust on site.

The procedure used to maximize pulse energy (with minimal temporal width) calls for the evacuation of the laser cavity of laser 21 by pump 24 to a base pressure of 95 mb. The products from a gas delivery system 25 are added. 100 mb of 5% fluorine/95% helium are fed to the cavity. Next, adding 160 mb of krypton and adding helium balance to achieve 2700 mb produces a total gas recipe. An increase in pulse energy and pulse width is obtainable by adding neon in place of 10 to 30% of the helium buffer gas. The rare gas port of gas delivery system 25 supplies 99.995% minimum purity krypton. A laser mixture of 5% fluorine and 95% helium is delivered to the-halogen port of the gas delivery system. All of the ports included in-line 0.5 micron filters F.

Optical path system 30 could be fabricated in accordance with a variety of contemporary beam direction systems. It is envisioned that improvements are incorporated such as a beam homogenizer to assure that the cross-sectional beam profile is of substantially of the same intensity so that the etching process is more precisely controllable.

A noteworthy arrangement for homogenizing a beam is disclosed in the invention of Stephen D. Russell et al. entitled "Fiber Bundle Homogenizer" U.S. Patent and Trademark Office Ser. No. 07/404,243. The homogenizer includes a closely packed ultraviolet grade optical fiber bundle array having its individual fibers intermingled in a random or preconceived format to result in an intermixing of the light from individual fiber cores to produce a uniform intensity profile. The output ends of the fibers are gathered or fused and optionally tapered before being cleaved to provide an output face that is custom shaped for a desired illumination pattern. The flexible nature of the fiber bundle allows for remote materials processing applications. When such a beam homogenizer is provided for, monitoring/alignment system 100 may include a selectably displaceable micro manipulator, that may be computer controlled if desired to assure that the homogenized beam traces a desired etch pattern on the sample.

Figure 7:
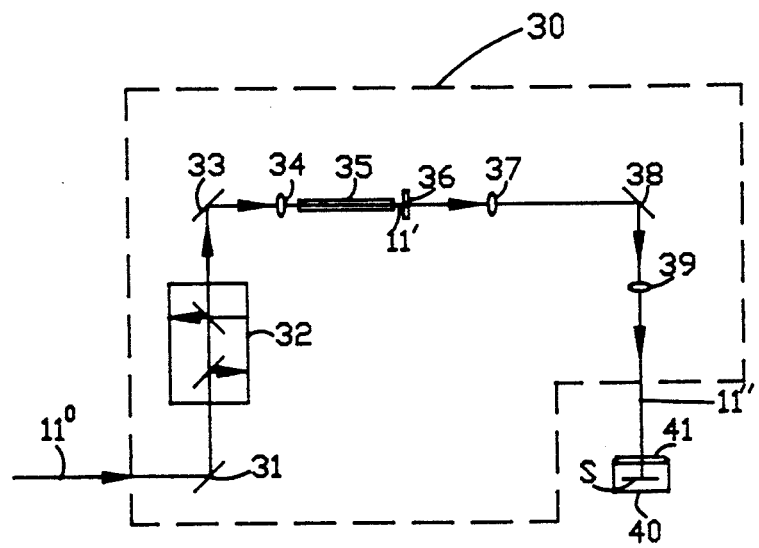
FIG. 7 shows a beam delivery system.

Another beam delivery system 30 is shown in FIG. 7 and has excimer laser beam 11° directed onto a dielectrically coated mirror 31 which has a 99% reflectivity at 248 nm (the laser wavelength of beam 11°). The mirror is disposed at an incident angle of 45° to deflect the beam into a compensating attenuator box 32.

The compensating attenuator box has pairs of dielectrically coated beamsplitters to dump some of the beam energy into its black anodized walls. This allows for control of the illuminating energy incident onto sample S while excimer laser 21 operates within its stable and highly efficient regime. The pair of beamsplitters within attenuator 32 is oriented in complementary directions to eliminate translation of the beam axis.

A dielectrically coated mirror 33 redirects the ultraviolet light for subsequent homogenization and shaping. Lens 34 is a UV grade fused silica which has been AR (antireflective) coated on both sides (typical of all such lenses in high-powered laser optical systems) to minimize high energy retroreflections. Lens 34 with a focal length of about 200 mm, is used to launch the excimer beam into a light tunnel 35.

The light tunnel is made of four identical aluminized fused silica plates joined to form a square hollow aperture and is positioned to achieve approximately four internal reflections for homogenization. It has been found that such a light tunnel has severe limitations in energy throughput although it achieves sufficient homogenization using the configuration herein described. Losses of roughly 60% of the laser energy are due to multiple reflections off the non-UV-enhanced aluminum and through ablation of the aluminum coating itself (UV-enhanced aluminum has a dielectric coating with a lower damage threshold, and its reflectivity is very angle sensitive, making it inappropriate for this application). A similar homogenizer can be constructed from a highly polished UV grade fused silica rod with a square cross-section, and a multitude of equivalent configurations. The beam homogenizer and any of its variations serve to provide a repeatable and controllable process; it is not necessary to achieve the laser-assisted chemical reaction described herein.

Homogenized beam 11' coming from the light tunnel is cropped to proper dimensions using an aperture 36 and is subsequently imaged and reduced in size as beam 11" using lenses 37 and 39. These lenses have focal lengths of 400 mm and 200 mm respectively, thereby yielding a 0.5 magnification factor when placed in a confocal configuration. A properly oriented dielectrically coated mirror 38 redirects the homogenized and imaged beam 11" to sample processing chamber 40 for the etching of silicon sample S allowing for the in situ viewing by monitoring/alignment system 100. The processing chamber has a window 41 that passes the homogenized and shaped beam 11". Typically the window is an uncoated UV-fused grade silica (Suprasil) blank, that exhibits roughly 8% loss due to reflections off its surfaces.

Figure 8:
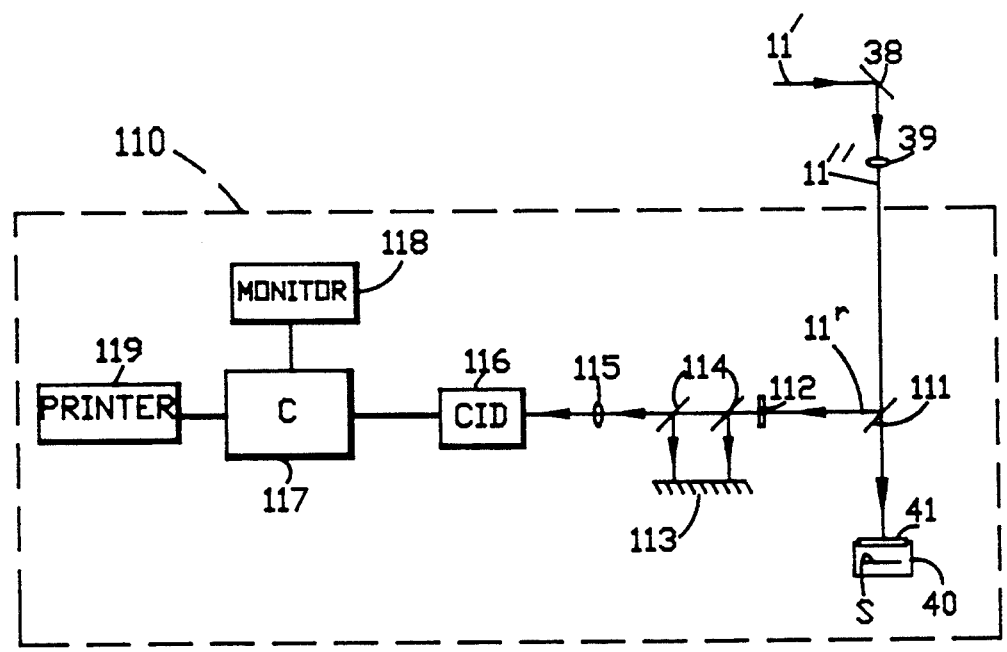
FIG. 8 is a beam diagnostic system that allows an observer to determine whether or not an appropriately imaged, homogenized beam profile is directed onto sample S.

Monitoring/alignment system 100 preferably has a beam diagnostic system 110 such as that shown in FIG. 8 when it is desired to monitor beam 11". The beam is intercepted before it reaches chamber 40 via a 15% beamsplitter 111 which reflects a portion 11' onto a fluorescent plate 112. The fluorescent plate exhibits a fluorescence of visible yellow light that is linearly proportional to the incident ultraviolet energy, in this case portion 11'. A typical fluorescent plate may be obtained from Taunton Technologies and is reported to have the capability for maintaining a linear relationship over five orders of magnitude.

The portion of UV energy that is transmitted by fluorescent plate 112 is directed onto a beam dump 113 consisting of two dielectrically coated mirrors 114 that reflect the 248 nm radiation into the beam dump but which pass the visible fluorescence of fluorescence plate 112. A compound lens 115 magnifies the image of the emitted fluorescence and directs it onto a charge injection device 116. The beam image, intensity contour, and profile are stored, processed, and outputted using a computer 117 (a Compaq model 286 computer) with peripheral monitor 118 and printer 119.

The beam diagnostic system of FIG. 8 allows an observer to determine whether or not an appropriately imaged, homogenized beam profile is directed onto sample S. The beam diagnostic subsystem of FIG. 8 provides the capability to monitor so that appropriate action can be taken to assure that the desired beam profile is presented.

Figure 9:
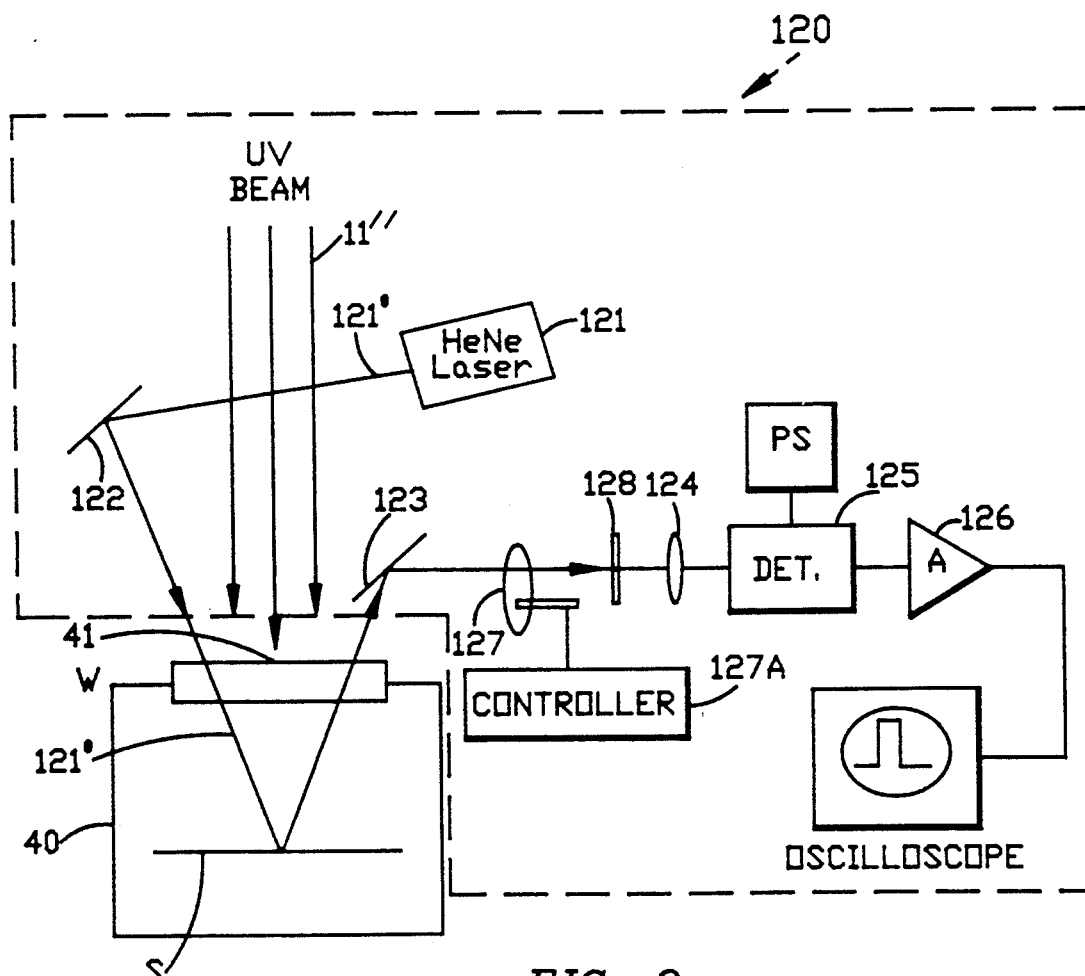
FIG. 9 is a representation of a reflectivity monitoring system.

Monitoring/alignment system 100 may also have a reflectivity monitor 120 such as shown in FIG. 9. The reflectivity monitor is used to confirm the laser fluence and act as a process control parameter to enable subsequent corrective action such as changing the laser's fluence and/or pulse repetition rate. The quantity of laser fluence is expressed in $J/cm^2$ and governs the thermally activated chemical reactions in the silicon sample to be discussed below. The basis for this technique for monitoring laser fluence relies on the phenomena of variation of reflectivity of silicon in the molten state (approximately 70% at 633 nm) compared to silicon in the crystalline state (approximately 30% at 633 nm).

Reflectivity monitor 120 has a helium neon laser 121 emitting a beam 121° onto silicon sample S via an aluminized mirror 122 that is coincident with impinging UV laser pulse 11". If the UV fluence of beam 11" is above the melt threshold for silicon (approximately 0.7 $J/cm^2$), an increase in reflected intensity of beam 121° will be observed. The reflected beam is directed by a mirror 123 through a microscope objective 124 having a numerical aperture of 0.25 and magnification of 10×.

This image is focused onto a photodetector 125 for detection of the melt signal. Typically, a photodetector could be an RCA type C30902E avalanche photodiode integrated with an Analog Modules Model 713-4-B preamplifier 126 which exhibited immunity to electromagnetic interference when compared to photomultiplier detection. The avalanche photodiode 125 was AC coupled and therefore initial alignment required the use of a chopper wheel 127 with controller 127a (a Stanford Research Systems Model SR540). A 633-nm interference filter 128 with a bandwidth of ±10 nm, removed any UV component to the reflected signal and prevented saturation of photodetector 125. The resulting signal from the photodetector then was sent to an oscilloscope for monitoring the melt duration.

Melt durations from 30 to 80 nsec were obtained by varying the incident fluence. Above the ablation threshold for silicon (approximately 2.2 $J/cm^2$), the silicon surface became rough, which increased the diffuse scattering of the helium-neon laser beam 121° and resulted in a decreased and eventually nonexistent reflectivity signal.

Figure 10:
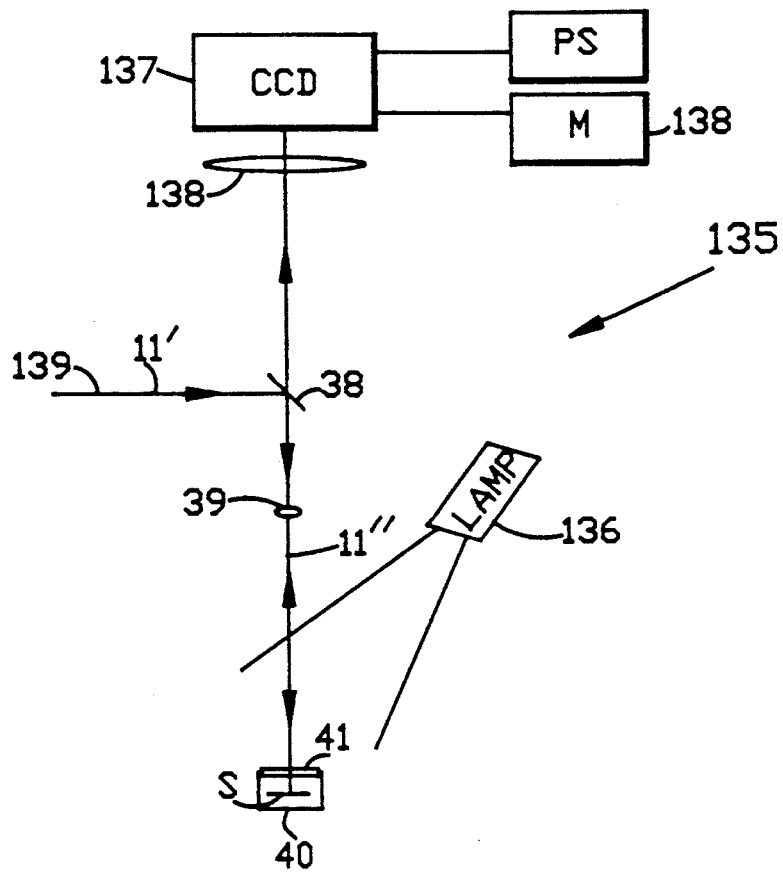
FIG. 10 depicts an in situ monitoring system.

Monitoring/alignment system 100 has an in-situ monitoring system 135 used for the positioning of the sample below the incident UV beam 11", see FIG. 10. An incandescent lamp 136 illuminates sample S. A CCD camera 137 and appropriate monitor system 138 provide indications of alignment when lens 138 collects both the scattered incandescent light and the visible light 139 coming from a visible alignment laser beam collinear with the invisible laser beam 11' and 11". The visible alignment laser beam 139 may be included within excimer laser 21 or provided as an external subsystem.

Figure 11:
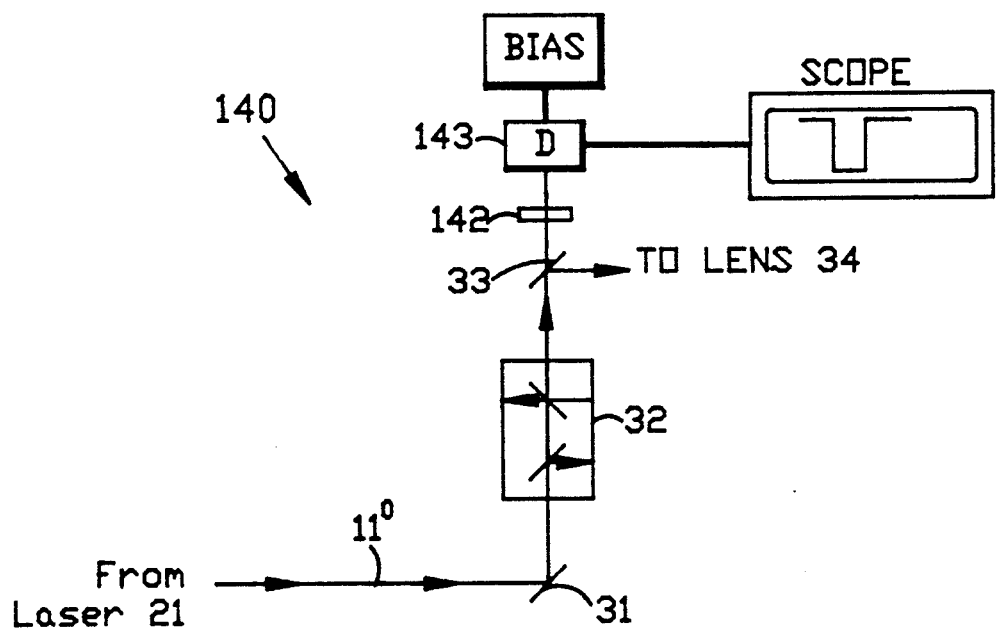
FIG. 11 shows a temporal profile measurement system.

Monitoring/alignment system 100 has a temporal profile measurement system 140 such as that shown in FIG. 11. This system is primarily used to control the laser melt depth (which varies with absorbed energy) from the laser pulses. A small percentage (1%) of the of UV light 11° which passes through a dielectric mirror 33 is sent to filter 142 and a p-i-n photodiode 143. The scope provides an indication of the temporal profile. The pulse width has been observed to lengthen as the gas mixture ages and by adding neon to the standard gas mixture.

Halocarbon (chlorofluorocarbon) process gas delivery and control system 70 is used to control the environment within processing chamber 40 and thereby introduce the proper halocarbon gas 40' at the correct pressure. Thus, process gases of various halocarbons provided a constant source of desired gas. Table II lists some common halocarbons and their trade names.

TABLE II

| Common Halocarbons | | |
|---|---|---|
| Trade Name | Scientific Name | Chemical Formula |
| Freon-11 | Trichlorofluoromethane | $CCl_3F$ |
| Freon-12 | Dichlorodifluoromethane | $CCl_2F_2$ |
| Freon-13 | Chlorotrifluoromethane | $CClF_3$ |
| Freon-13B1 | Bromotrifluoromethane | $CBrF_3$ |
| Freon-14 | Tetrafluoromethane | $CF_4$ |
| Freon-22 | Chlorodifluoromethane | $CHClF_2$ |
| Freon-23 | Fluoroform | $CHF_3$ |
| Freon-113 | 1,1,2-Trichlorotrifluoro-ethane | $C_2Cl_3F_3$ |
| Freon-114 | 1,2-Dichlorotetrafluoro-ethane | $C_2Cl_2F_4$ |
| Freon-115 | Chloropentafluoroethane | $C_2ClF_5$ |
| Freon-116 | Hexafluoroethane | $C_2F_6$ |
| Freon-500 | Dichlorodifluoromethane/ 1,1 Difluoroethane | $CCl_2F_2/C_2H_4F_2$ |
| Freon-501 | Chlorodifluoromethane/ Dichlorodifluoromethane | (mixture of above) |
| Freon-502 | Freon-22/Freon-115 | (mixture of above) |
| Freon-503 | Freon-23/Freon-13 | (mixture of above) |
| Halocarbon-41 | Methyl Fluoride | $CH_3F$ |

The art is replete with a number of suitable valving and gas flow controls and appropriate pressure monitors. Furthermore, nitrogen purging for the system is provided for in system 70 in accordance with established procedures to avoid contaminating and purging of the selected gases and all fittings and conduits appropriately are selected for the intended gases.

Sample processing chamber 40 is suitably fabricated to contain pressurized chlorofluorocarbon gas 40' and is provided with a window 41 which allowed for passage of the UV beam 11" and associated diagnostic beams as discussed above. Sample S was mounted in the chamber on an oxygen-free high conductivity copper platen 42. The platen was custom designed for flow-through cooling with an ethylene glycol-based antifreeze coolant so that this arrangement was found to effectively eliminate temperature gradients. The coolant's fluid was temperature controlled and circulated in accordance with well-established techniques and the temperature of the platen itself was monitored with a platinum resistance temperature detector interconnected to appropriate readouts.

The laser-assisted etching of silicon, be it for the backside of CCDs or other semiconductor applications, generally follows the same procedure. The silicon sample to be etched is placed within processing chamber 41 on platen 42. A desired halocarbon ambient 40' is introduced by system 70 within a predetermined pressure range which is needed by the job at hand. Typically, the halocarbon is of the chlorofluorocarbons which by themselves are nonreactive. As mentioned above, the halocarbon ambient is introduced within the pressure range required for a desired etch rate. When chloropentafluoroethane is used, 800 torr has been found to be acceptable although other pressures may be used.

The sample is maintained at a predetermined cooled temperature by resting it on the cooled copper platen 42. A useful temperature at which to maintain the substrate of silicon S is 273 K (0° C.) although other temperatures may be attained and maintained for the duration of a particular . processing application as the idiosyncracies of a different job may dictate.

An excimer laser beam 11" is appropriately homogenized and shaped or may be configured or patterned, if appropriate, and directed onto the sample to be etched. The exact beam steering arrangement which forms a part of monitoring/alignment system 100 is not elaborated on at this time since a wide variety of optical beam deflection techniques have evolved over the years. Mechanical deflection schemes as well as optical deflection techniques (more optimally computer-controlled) could be used to appropriately direct beam 11" onto a desired track or pattern on the surface of silicon sample S.

The pulsed energy of beam 11" is set to obtain the optimal fluence impinging onto sample S. Given the above conditions an incident fluence of 1.7 J/cm$^2$ will result in an etch rate of about 4 angstroms per pulse. Next, the sample is removed from processing chamber for subsequent processing.

Figure 12:
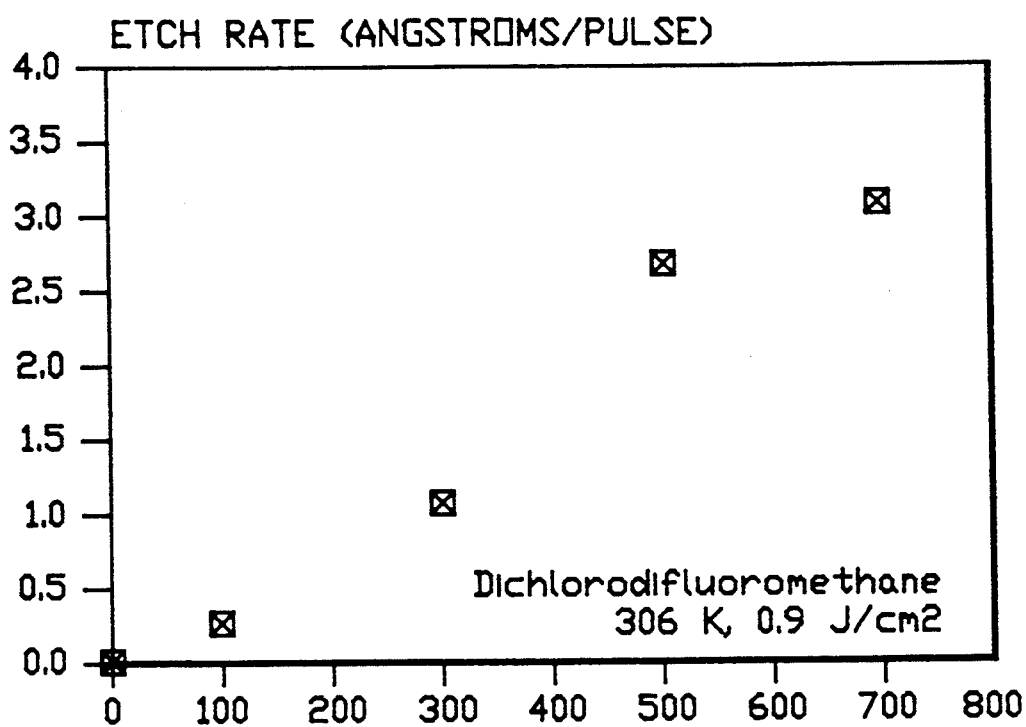
FIG. 12 shows the etch rate as a function of gas pressure for dichlorodifluoromethane.

Examination of gas phase etching of silicon by chlorofluorocarbon (freon) ambients at pressures below 1 torr, showed negligible etching for fluoroform ($CHF_3$, Freon-23), dichlorodifluoromethane ($CCL_2F_2$, Freon-12) and chloropentafluoroethane ($C_2ClF_5$, Freon-115) below the ablation threshold. Since the processing chamber was substantially constructed to withstand increased pressures, these halocarbons were subjected to much higher gas pressures. The higher pressures allow a greater concentration of adsorbed molecules onto the silicon surface inside the reaction chamber which can subsequently be dissociated (presumably pyrolytically) by the excimer laser pulses. FIG. 12 shows the etch rate as a function of gas pressure for dichlorodifluoromethane (Freon-12), note a negligible etch rate for pressures below 100 torr. This explains why there is no evidence of etching when ambient pressures are below 1 torr. At 700 torr, a maximum etch rate of 3 angstroms per pulse was found. Higher pressures led to deposition of desorbed by-products onto the chamber window which can be avoided by appropriate modifications to the processing chamber.

The phenomena associated with the laser-assisted chloropentafluoroethane (Freon-115) etching of silicon can be broken down into three distinct identifiable parts. The first part involved etch rate and surface quality. Successful results led to an attempt to immediately transfer to the processing of a silicon device. The processing of a packaged die, and its limitations are discussed in greater detail below which embodied the second part of the etching process. The third part which concerns the underlying chemical and physical reactions in-depth is discussed below along with the first part.

Chloropentafluoroethane (Freon-115), again exhibits negligible evidence of etching below 100 torr of gas pressure. Under identical conditions, the etch rate for chloropentafluoroethane (Freon-115) increases faster with pressure compared to dichlorodifluoromethane (Freon-12) with a rate of 3.3 angstroms per pulse at 500 torr (and 296K). This higher etch rate shows significant promise and, since operating at this pressure did not cause problems with the chamber window, it opens the way for widespread application.

Figure 13:
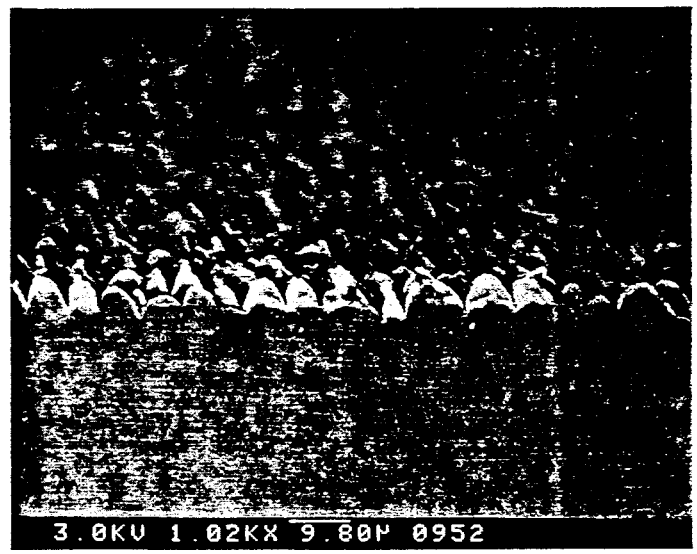
FIG. 13 shows a cross-sectional SEM photomicrograph of the laser-etched surface using chloropentafluoroethane.
Figure 16A:
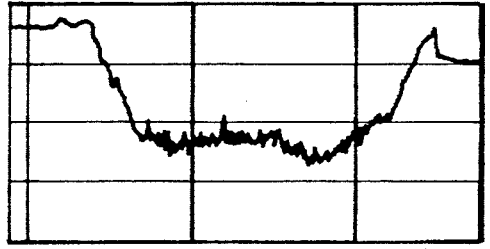
FIG. 16 shows etch profiles for various doping types and concentrations.
Figure 16B:
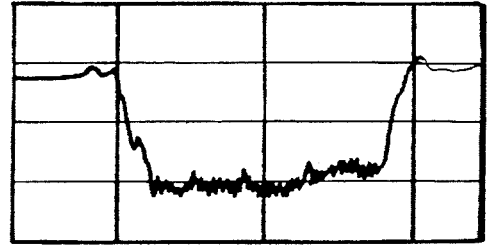
Figure 16C:
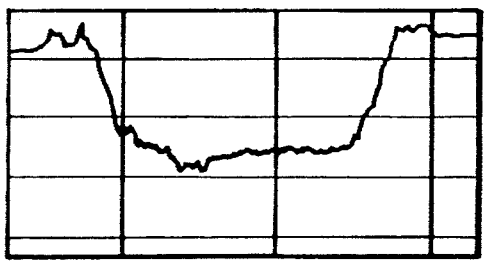
Figure 16D:
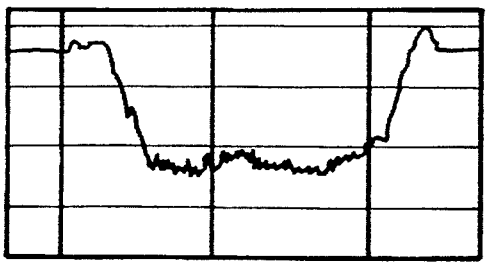

FIG. 13 shows a cross-sectional SEM photomicrograph of the laser-etched surface using chloropentafluoroethane (Freon-115). Roughness is on the order of 3 to 4 microns which is comparable to a KOH etch.

Figure 14:
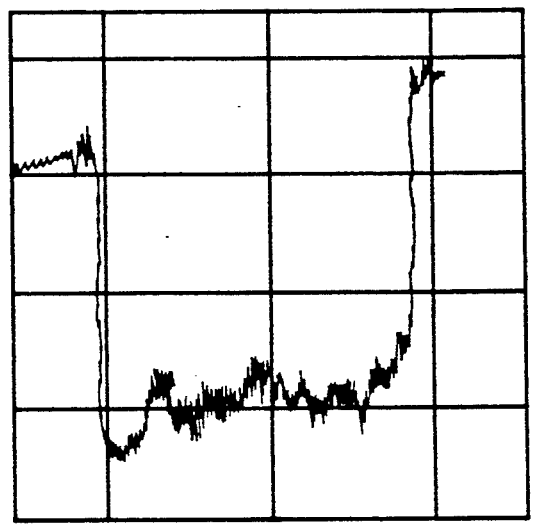
FIG. 14 shows a stylus profilometer trace of silicon laser etched in chloropentafluoroethane without remelting.
Figure 15:
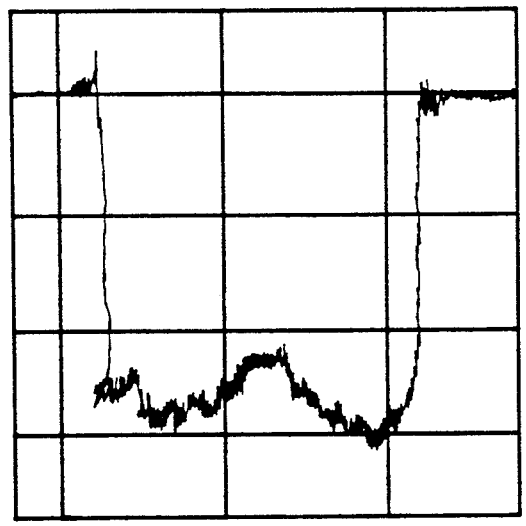
FIG. 15 shows an identically processed sample which had subsequent laser remelting of the etched area in a helium ambient.

Experiments in laser remelting in a helium atmosphere after etching failed to improve the surface quality significantly. FIG. 14 shows a stylus profilometer trace of silicon laser etched in chloropentafluoroethane (Freon-115) without remelting. FIG. 15 shows an identically processed sample which had subsequent laser remelting of the etched area in a helium ambient.

No significant change is visible on this macroscopic scale. SEM photomicrographs of the chloropentafluoroethane (Freon-115) etched surfaces with and without the laser remelt showed no apparent improvement in overall surface quality. Variation in the incident laser fluence for the remelt did not change these results. Following a conventional smoothing process, a chloropentafluoroethane (Freon-115) etched sample was Dash etched, as described earlier, which resulted in isotropic smoothing visible in a SEM photomicrograph. These operations, performed on bulk $P^+$-Si wafers, did not have the benefit of a p-type epi-layer etch stop available on typical CCD wafers.

These operations were repeated on the mechanically polished backside of a CCD wafer which had been thinned to about 180 microns to reduce laser processing time. The sample was then laser etched in 300 torr of chloropentafluoroethane (Freon-115) for 114 minutes at 50 Hz (laser fluence above the silicon melt threshold). Next, it was Dash etched to remove the remaining 20 to 40 microns of $p^+$ material resulting in a smooth, shiny membrane.

The thickness of the membrane was measured using an interferometric technique. The interferogram obtained yielded a thickness of 7.1 microns±0.1 micron. The sample exhibited the characteristic bow and red transmission properties of thin silicon membranes prepared by low yield conventional techniques.

FIG. 16 depicts etch rate as a function of doping type and concentration using boron doped silicon with resistivity 0.006 to 0.020 ohm-cm (p+) and 1.0 to 2.0 ohm-cm (p), and phosphorous doped silicon with resistivity 1.1 to 1.8 ohm-cm (n) and 0.006 to 0.020 ohm-cm (n+). Under the conditions of 725 torr (96.4 kpa), 285K platen temperature, 0.8 J/cm$^2$ at 50 Hz, the p+Si sample exhibits a mean etch rate of 6.8±0.3 angstroms per pulse. The p, n, and n+ type Si samples show a slightly higher etch rate of 7.3±0.3 angstroms per pulse. This difference is not significant, and agrees with the results of Horiike et al., supra, who reported an etch rate independent of sheet resistance and type while etching silicon with fluorine atoms photodissociated from NF$_3$. This was attributed to the high Pauli electronegativity (4.00) of the fluorine atom allowing adsorbed fluorine species to take valence electrons from the silicon surface atoms independent of doping type. Note that these results suggest a mechanism different than the photo-oxidation/reduction reactions observed for the fluoro-silicon system which exhibit significant doping effects, see the articles referred to above to F. A. Houle and H. F. Winters et al. This implies that under the high fluence conditions the most important effect on the silicon reaction is thermal activation rather than a field-enhanced reaction.

Figure 17:
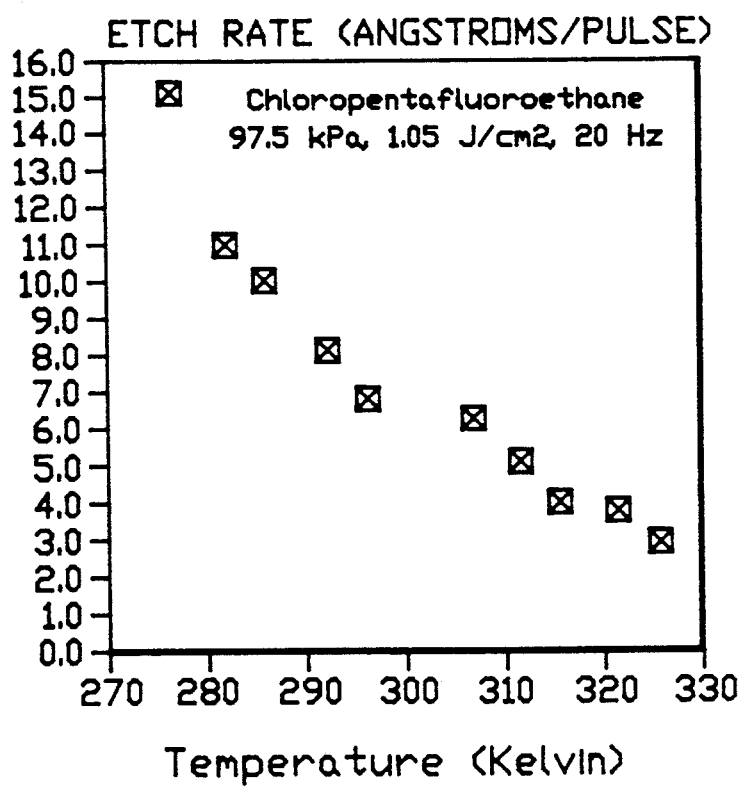
FIG. 17 shows etch rate as a function of temperature at
733 torr (
97.5 kPa) and
1.05 J/cm$^2$ in a chloropentafluoroethane ambient.

Etch rate as a function of temperature is shown at 733 torr (97.5 kPa) and 1.05 J/cm$^2$ in FIG. 17. Laser repetition rate of 20 Hz (0.84 W) minimizes the steady-state heating of the sample that might be said to be caused by the duty cycle of the laser pulses. At 276K, an etch rate of 15.3±0.3 angstroms/pulse is observed, which decreases with increasing temperature. Such behavior is consistent with a Brunauer-Emmett-Teller (B-E-T) adsorption mechanism with higher sticking coefficients at lower temperatures. This well-known model allows for multilayer adsorption of molecules, and exhibits a functional form for the percentage of monolayer coverage, theta, given in the above cited article by S. Brunauer et al. entitled "Adsorption of Gases in Multimolecular Layers", *J. Am. Chem.Soc,* 60, 309, (1938):

$$\text{theta} = \frac{cx}{(1-x)[1+(c-1)x]}$$

where $x = P/P_0$ ($P_0$ is the vapor pressure of the gas at ambient temperature), c is a constant related exponentially to the heats of adsorption of the first and subsequent layers.

Figure 18:
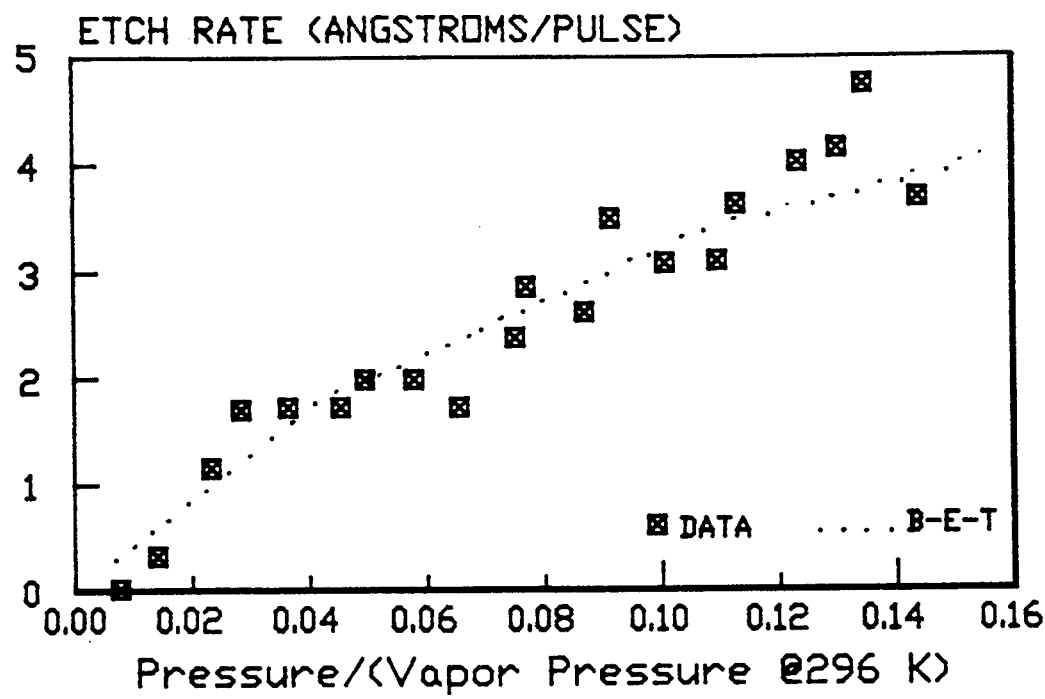
FIG. 18 shows the pressure dependence of the etch rate, with a dashed line showing a B-E-T isotherm.

FIG. 18 shows the pressure dependence of the etch rate, with a dashed line showing a B-E-T isotherm. This was obtained with the assumption of a linear relationship between the etch rate and surface coverage. This suggests adsorption as the primary etch rate limiting mechanism. However, since physisorption bond energies are in the range 0.01 to 1 eV (van der Waals forces), and chemisorption processes exhibit covalent and ionic bonds whose energies are typically 1 to 8 eV, laser-induced desorption via thermal heating cannot be ruled out as a coexisting phenomenon, note R. Gauthier's "Mechanism Investigations of a Pulsed Laser Light Induced Descrption", *Phys. Stat Sol. (A),* 38, 447 (1976).

Figure 19:
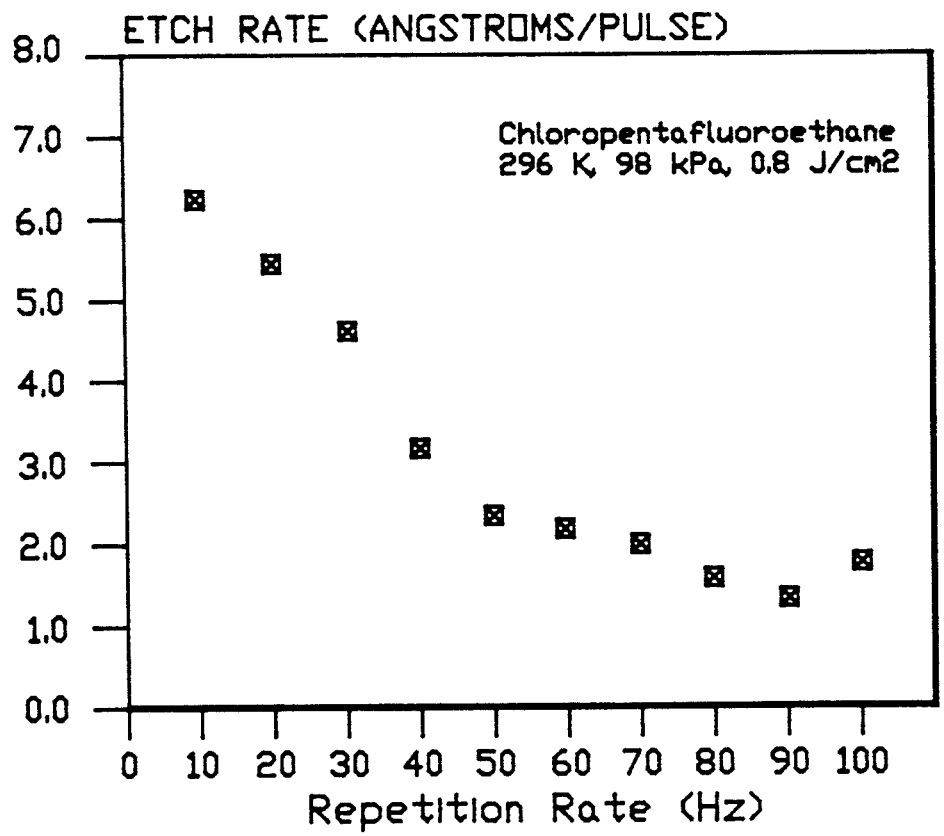
FIG. 19 shows the etch rate versus laser repetition rate at a constant sample (platen) temperature at
737 torr (
98 kPa) and
0.80 J/cm$^2$
Figure 20A:
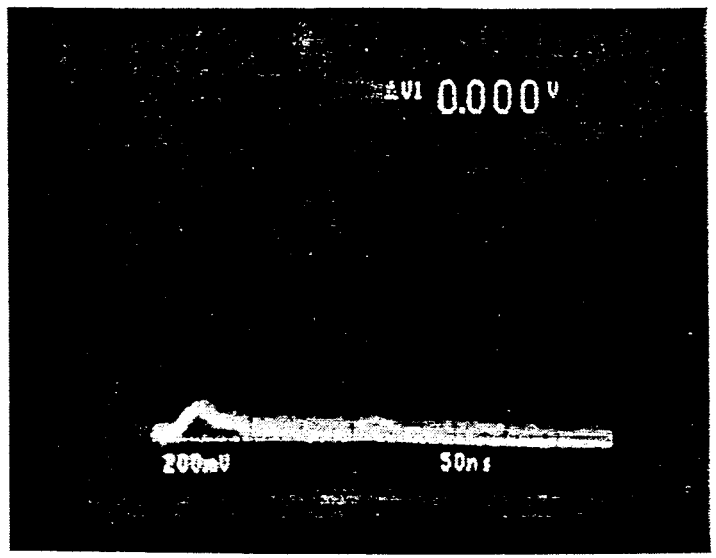
FIG. 20 shows the effect of laser heating of the sample detected by the reflectivity monitor.
Figure 20B:
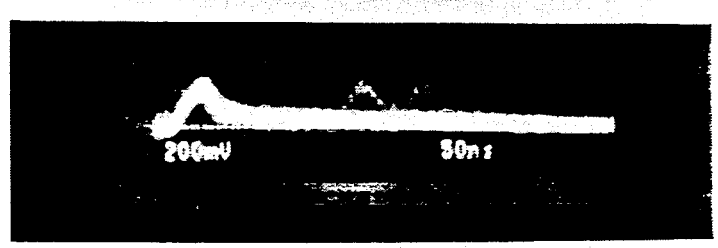
Figure 20C:
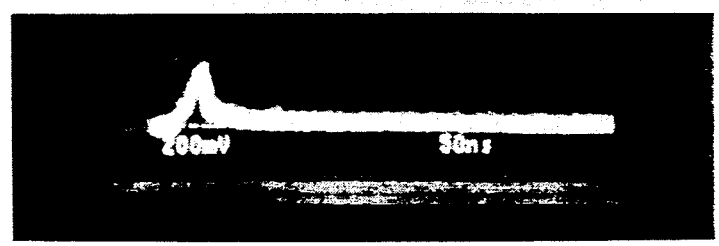
Figure 20D:
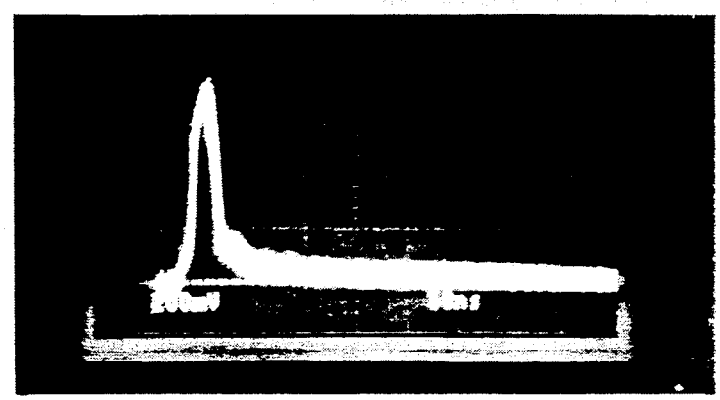

FIG. 19 shows the etch rate versus laser repetition rate at a constant sample (platen) temperature at 737 torr (98 kPa) and 0.80 J/cm$^2$. A dramatic decrease in etch rate with increasing laser repetition rate was discovered. This effect correlates with increased steady-state heating of the sample due to the increased duty cycle of the laser. At repetition rates greater than or equal to 20 Hz, an uncooled sample exhibits significant temperature rise in an ambient of ~760 torr (typical processing pressure). At 100 Hz (0.8J/cm$^2$ fluence per pulse), a silicon sample rose to a steady-state temperature of 40K above the ambient at atmospheric pressure. The decrease in etch rate between a sample processed at 100 Hz compared to 20 Hz under identical conditions was nearly identical to that of increasing the platen temperature 40° K. (shown in FIG. 17). This is consistent with the rate-limiting mechanism discussed above.

FIG. 20 shows the effect of laser heating of the sample detected by the reflectivity monitor 120 in a 20 torr helium ambient. As described above, the detected signal is proportional to the reflectivity of the portion of silicon illuminated by the HeNe laser. The top trace is representative of an oscilloscope trace that shows the reflectivity signal after 5 minutes (without substrate cooling) of laser illumination with 15 W of laser power and single pulse fluence below the melt threshold. Only a portion of the silicon illuminated by the HeNe was raised above the melt threshold. The lower traces in FIG. 20 represent laser powers of 17.5, 20, and 22.5 W all exhibiting increased heating during 5 minutes, with the lower trace showing clear melting of the whole region illuminated by the excimer laser pulses.

The preceding description referred to excimer laser-assisted etching of silicon in a chloropentafluoroethane (Freon-115) ambient with incident fluences between the melt and ablation thresholds (~0.7 J/cm$^2 \leq 0 \leq$ ~2.2 J/cm$^2$). The etch rate increases with increasing ambient pressure, while it decreases with increased sample temperature. These effects are consistent with an adsorption limiting mechanism and possibly a coexisting laser-induced desorption. This reaction is insensitive to crystal orientation and doping concentration and type, implying a purely photothermal reaction.

Proof of the advantages of this etching process is apparent by a demonstration of three items: (1) obtaining a polished silicon membrane as described above, (2) a deep etch (>200 microns) with reasonable processing time and (3) etching of a packaged die.

Design of chamber 40 was made so that high volume flow (>1 slm) of chlorofluorocarbon etch gas crossed the chamber window and the laser pulse repetition rate was lowered to prevent deposition of etched material onto chamber window 41. Having measured the etch rate as a function of chloropentafluoroethane (Freon-115) gas pressure up to and above atmospheric pressure (see FIG. 5), it can be noted that between 525 and 700 torr (~70 to ~93 kPa) there is little variation in etch rate with changes in pressure. This allows for a manufacturable processing window which is insensitive to gas pressure variations. In addition, the etch rates shown in this figure can be substantially.increased by sufficient sample cooling (as shown by FIG. 17).

Figure 21:
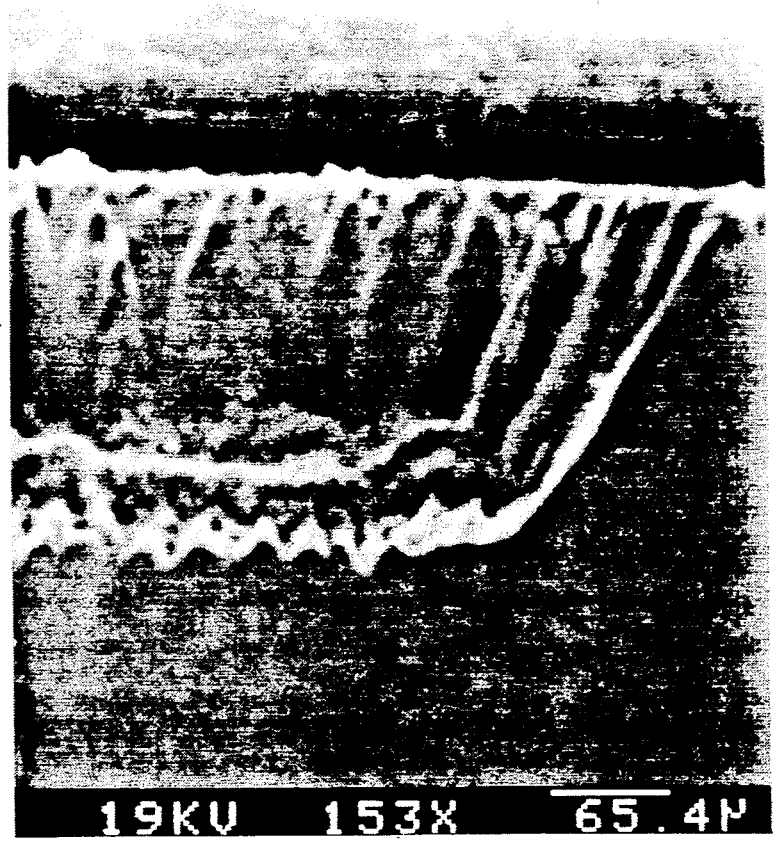
FIG. 21 shows an SEM photomicrograph of a deep laser etch.

FIG. 21 is a SEM cross-sectional photomicrograph of a deep etch using chloropentafluoroethane (Freon-115) as the etchant. The etch depth is 201 microns with a surface roughness of ±22 microns. The starting material was an unpolished backside of a CCD wafer; the 1.6 micron initial roughness did not seriously affect the laser-etched surface quality. An aspect ratio of 2:1 is shown for the laser etched sidewall in FIG. 21. This is superior to the KOH etch, and further improvement beyond what is portrayed in FIG. 21 has been obtained with careful optical alignment and improved depth of focus as evidenced by profilometer traces in FIG. 14 and FIG. 15.

By converting to an etch rate in units of angstroms/sec it can be noted that no significant advantage in processing time can be attained by increasing the repetition rate above ~50 Hz due to the rate-limiting mechanism described above. However, the etch rates observed are substantially greater than the ~1 angstroms per pulse reported previously for laser-assisted etching of silicon (below the ablation threshold), and therefore the rate-limiting mechanism is not a detriment for practical processing.

Etching of a packaged die in packages which are used for electrical testing did not damage the frontside metalization, wire bonding, or gold eutectic for package bonding. Chloropentafluoroethane (Freon-115) does not react with any portion of the package or die, except the silicon in the area illuminated by the excimer laser. Identical results are expected for any conceivable package due to the inert nature of this gaseous halocarbon.

Nonfunctional die which were unthinned for electrical testing were subsequently laser etched in chloropentafluoroethane (Freon-115). Deep etches were produced demonstrating the applicability for etching partially fabricated devices.

The laser-assisted etching process described above utilizes inherently nonreactive or noncorrosive halocarbon ambients. The halocarbons only react with the silicon where the laser is impinging with sufficient fluence. Therefore, etching in a pretested packaged die can be performed without excessive handling, damage or complex masking. As a consequence, there will be a significant elimination of the processing steps to increase the overall reliability and yield. For pattern etching the nonreactive halocarbon ambients provides maskless processing. For backside thinning the laser-assisted etching process disclosed herein has the capability to significantly improve the performance of CCDs without many of the drawbacks of conventional thinning techniques. The high degree of anisotropy of the etch by this technique exceeds that of standard wet etches such as potassium hydroxide and is useful as a highly selective etch. The noncorrosive halocarbon ambient, laser-induced chemical reactions of the maskless, contactless etching process is a much needed advance for the state of the art.

Other halogen-containing ambients may be suitable alternatives to the halocarbons (for example iodides, bromides, chlorides or fluorides with appropriate variations in process parameters. Variations of substrate temperature, doping concentration and crystal orientation also can be accommodated by the method of this disclosed concept by an appropriate variation of the methods of one skilled in the art to which this invention pertains. The laser-assisted etching process herein described has mentioned only pulsed UV energy for the purposes of demonstration only. CW energy may be suitable for some applications. Laser wavelength also is variable in order to vary the decomposition mechanism of the ambient gas and the adsorption depth of the sample to optimize specific production requirements.

The foregoing has concerned itself with the effects on silicon. It is to be understood that the III-V semiconductor compounds gallium arsenide, GaAs, or indium phosphide, InP and their related ternary and quaternary compounds, as well as others in this group, could be processed in place of silicon to be suitably configured within the scope of this process and apparatus as is apparent to those skilled in this art. These III-V semiconductor compounds are suitably processed in the chlorofluorocarbon ambients as distinguished from the broader class of halocarbons. It further is to be understood that the II-VI semiconductor compounds cadmium sulfide, CdS, or zinc selenide, ZnSe, and their related ternary and quaternary compounds, as well as others in this group, could be processed in place of silicon, to be suitably configured within the scope of this process and apparatus as is apparent to those skilled in this art. These II-VI semiconductor compounds are suitably processed in the chlorofluorocarbon ambients as distinguished from the broader class of halocarbons.

Obviously, many modifications and variations of the present invention are possible in the light of the above teachings. It is therefore to be understood that within the scope of the appended claims the invention may be practiced otherwise than specifically described.

We claim:

1. An apparatus for maskless laser-assisted etching of III-V semiconductor compound sample in a gaseous chlorofluorocarbon ambient comprising:
   a source of said gaseous chlorofluorocarbon ambient;
   a chamber sized to contain said III-V semiconductor compound sample therein and coupled to said source of said gaseous chlorofluorocarbon ambient to receive said gaseous chlorofluorocarbon ambient therein to provide said gaseous chlorofluorocarbon ambient in contact with said III-V semiconductor compound sample;
   an emitter of radiant energy oriented to direct said radiant energy into said chamber and onto said III-V semiconductor compound sample in contact with said gaseous chlorofluorocarbon ambient, said radiant energy being emitted at a sufficient level to create a melted portion of said III-V semiconductor compound sample where the radiant energy impinges to etch away only said melted portion of said III-V semiconductor compound in contact with said gaseous chlorofluorocarbon ambient which has said radiant energy impinging thereon.

2. An apparatus according to claim 1 in which said radiant energy emitter is a laser emitting a UV wavelength beam.

3. An apparatus according to claim 2 in which said chamber has a portion for transmitting said UV wavelength beam therethrough onto said III-V semiconductor compound sample.

4. An apparatus according to claim 3 in which said chamber is fabricated to be capable of containing said chlorofluorocarbon ambient pressurized within predetermined limits and said UV wavelength beam is at predetermined rates and intensities to assure that said III-V semiconductor compound sample is melted but not ablated thereby.

5. An apparatus according to claim 4 further including:
   a shaper and homogenizer of said UV wavelength beam in which the beam is shaped, homogenized and adjusted in magnitude to obtain an optimal fluence for impinging onto said III-V semiconductor compound sample.

6. An apparatus according to claim 5 further including:
   a pressurization system in which the pressure of said ambient chlorofluorocarbon is raised to levels greater than 150 torr.

7. An apparatus according to claim 6 in which the pressurization system raises the pressure of said ambient chlorofluorocarbon to between 600 and 900 torr and said emitter emits said radiant energy to have an incident fluence of said UV wavelength beam sufficient to melt the sample.

8. An apparatus according to claim 1, 2, 3, 4, 5, 6 or 7 in which said III-V semiconductor compound is InP and related ternary and quaternary compounds.

9. An apparatus according to claim 1, 2, 3, 4, 5, 6 or 7 in which said III-V semiconductor compound is GaAs and related ternary and quaternary compounds.

10. An apparatus according to claim 8 in which said source of said gaseous chlorofluorocarbon ambient provides gaseous chloropentafluoroethane.

11. An apparatus according to claim 8 in which said source of said gaseous chlorofluorocarbon ambient provides gaseous dichlorodifluoromethane.

12. An apparatus according to claim 9 in which said source of said gaseous chlorofluorocarbon ambient provides gaseous chloropentafluoroethane.

13. An apparatus according to claim 9 in which said source of said gaseous chlorofluorocarbon ambient provides gaseous dichlorodifluoromethane.

14. An apparatus for maskless laser-assisted etching of II-VI semiconductor compound sample in a gaseous chlorofluorocarbon ambient comprising:
   a source of said gaseous chlorofluorocarbon ambient;
   a chamber sized to contain said II-VI semiconductor compound sample therein and coupled to said source of said gaseous chlorofluorocarbon ambient to receive said gaseous chlorofluorocarbon ambient therein to provide said gaseous chlorofluorocarbon ambient in contact with said II-VI semiconductor compound sample;
   an emitter of radiant energy oriented to direct said radiant energy into said chamber and onto said II-VI semiconductor compound sample in contact with said gaseous chlorofluorocarbon ambient, said radiant energy being emitted at a sufficient level to create a melted portion of said II-VI semiconductor compound sample where the radiant energy impinges to etch away only said melted portion of said II-VI semiconductor compound in contact with said gaseous chlorofluorocarbon ambient which have said radiant energy impinging thereon.

15. An apparatus according to claim 14 in which said radiant energy emitter is a laser emitting a UV wavelength beam.

16. An apparatus according to claim 15 in which said chamber has a portion for transmitting said UV wavelength beam therethrough onto said II-VI semiconductor compound sample.

17. An apparatus according to claim 16 in which said chamber is fabricated to be capable of containing said chlorofluorocarbon ambient pressurized within predetermined limits and said UV wavelength beam is at predetermined rates and intensities to assure that said II-VI semiconductor compound sample is melted but not ablated thereby.

18. An apparatus according to claim 17 further including:
   a shaper and homogenizer of said UV wavelength beam in which the beam is shaped, homogenized and adjusted in magnitude to obtain an optimal fluence for impinging onto said III-IV semiconductor compound sample.

19. An apparatus according to claim 18 further including:
   a pressurization system in which the pressure of said ambient chlorofluorocarbon is raised to levels greater than An apparatus according to claim 9 in which said source of said gaseous chlorofluorocarbon ambient provides gaseous chloropentafluoroethane. 150 torr.

20. An apparatus according to claim 19 in which the pressurization system raises the pressure of said ambient chlorofluorocarbon to between 600 and 900 torr and said emitter emits said radiant energy to have an incident fluence of said UV wavelength beam sufficient to melt the sample 21. An apparatus according to claim 14, 15, 16, 17, 18, 19, or 20 in which said II-VI semiconductor compound is CdS and related ternary and quaternary compounds.

22. An apparatus according to claim 14, 15, 16, 17, 18, 19, or 20 which said II-VI semiconductor compound is ZnSe and related ternary and quaternary compounds.

23. An apparatus according to claim 21 in which said source of said gaseous chlorofluorocarbon ambient provides gaseous chloropentafluoroethane.

24. An apparatus according to claim 21 in which said source of said gaseous chlorofluorocarbon ambient provides gaseous dichlorodifluoromethane.

25. An apparatus according to claim 22 in which said source of said gaseous chlorofluorocarbon ambient provides gaseous chloropentafluoroethane.

26. An apparatus according to claim 22 in which said source of said gaseous chlorofluorocarbon ambient provides gaseous dichlorodifluoromethane.

* * * * *

UNITED STATES PATENT AND TRADEMARK OFFICE
CERTIFICATE OF CORRECTION

| | |
|---|---|
| PATENT NO. | : 5,310,989 |
| APPLICATION NO. | : 07/831830 |
| DATED | : May 10, 1994 |
| INVENTOR(S) | : Stephen D. Russell, Douglas A. Sexton and Richard J. Orazi |

It is certified that error appears in the above-identified patent and that said Letters Patent is hereby corrected as shown below:

On the title page item (54) and column 1, line 1, the first word of the title "METHOD" should be changed to --APPARATUS--.

Signed and Sealed this

Twenty-eighth Day of October, 2008

JON W. DUDAS
*Director of the United States Patent and Trademark Office*